(12) United States Patent
Jitramas et al.

(10) Patent No.: US 6,485,991 B1
(45) Date of Patent: Nov. 26, 2002

(54) SYSTEM AND METHOD FOR OUTPUT TRACK UNIT DETECTION AND SAFE STORAGE TUBE REMOVAL

(75) Inventors: Naramitr Jitramas, Bangkok (TH); Wattanapong Viriya, Mahasarakram (TH); Watcharin Namkang, Ratburana Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 56 days.

(21) Appl. No.: 09/864,580

(22) Filed: May 24, 2001

(51) Int. Cl.[7] ............................................. H01L 31/26
(52) U.S. Cl. ........................... 438/14; 438/15; 438/17; 438/26; 257/48; 206/701; 209/655; 414/421; 53/250
(58) Field of Search ..................... 438/14, 15, 17, 438/26; 53/250; 206/701; 209/655; 414/421

(56) References Cited

U.S. PATENT DOCUMENTS

| | | | | |
|---|---|---|---|---|
| 3,662,881 A | * | 5/1972 | Fineran | 209/655 |
| 4,645,402 A | * | 2/1987 | Gunderson | 53/250 |
| 4,647,269 A | * | 3/1987 | Wedel et al. | 414/421 |
| 5,207,350 A | | 5/1993 | Spanton | 221/105 |
| 5,307,011 A | | 4/1994 | Tani | 324/158 F |
| 5,909,657 A | | 6/1999 | Onishi et al. | 702/108 |
| 5,927,503 A | * | 7/1999 | Nevill et al. | 206/701 |
| 6,111,246 A | | 8/2000 | Watanabe et al. | 250/222.1 |

* cited by examiner

Primary Examiner—Matthew Smith
Assistant Examiner—B. V. Keshavan
(74) Attorney, Agent, or Firm—Amin & Turocy, LLP (57) ABSTRACT

Systems and methods are disclosed for testing semiconductor devices, using a tester providing tested semiconductor devices to a device output track, which feeds the semiconductor devices into a storage tube. The tester selectively removes the storage tube from the output track when the tube is filled and when no device is in the output track proximate the semiconductor storage tube. In addition, the tester refrains from removing the storage tube from the output track when a semiconductor device is in the device output track proximate the storage tube, so as to prevent or reduce damage to semiconductor devices during removal of the storage tube from the output track.

21 Claims, 7 Drawing Sheets

SYSTEM AND METHOD FOR OUTPUT TRACK UNIT DETECTION AND SAFE STORAGE TUBE REMOVAL

FIELD OF THE INVENTION

The present invention relates generally to semiconductor manufacturing processes and equipment, and more particularly to methods and systems for detecting units in an output track of semiconductor test equipment and for safely removing semiconductor storage tubes therefrom.

BACKGROUND OF THE INVENTION

Semiconductor devices are typically constructed in large quantities on a wafer of silicon. Such devices include an integrated circuit (IC) die, which is mounted onto the die-mounting pad of a leadframe. Wire attachment pads on the die are then connected with corresponding leads on the leadframe, typically with aluminum or gold wire during a wire bonding process. The die and leadframe are then encapsulated in a plastic or ceramic package, thus yielding an IC "chip" semiconductor device. During the manufacturing and testing of such devices, the chips are commonly stored in protective containers, such as a plastic tube with plugs at both ends to prevent the chips from falling out of the tube during handling or shipment.

Semiconductor devices, including integrated circuits are stored in plastic tubes to protect the devices, and particularly the leads thereof, in order to prevent damage such as bending and breaking. In addition to providing for storage ease and mechanical protection for the semiconductor devices, the storage tubes also provide protection against electrostatic discharge (ESD) by the use of appropriate materials in the construction of the tubes. Certain types of storage tubes have a platform or rib extending longitudinally through the center of the tube on which the body of the device is supported with the conductor leads on each side of the device separated by the platform.

Each end of the tube may include vertically oriented holes through which a resilient pin type plug may be inserted to extend through the tube, in order to prevent the devices from falling out of the tube. Alternatively, or in combination, soft foam type rectangular plugs may be inserted into one or both longitudinal ends of the tube to ensure against devices exiting the tube during handling. Since the plug needs to remain in the storage tube without falling out, the end of the pin type plugs may be slightly enlarged to hold the plug in the end of the tube and remain there until forcibly removed. The foam type plugs generally remain inserted in the tube ends via a frictional interference fit. In addition to the vertical holes located near the ends of the tube, additional holes may be provided in the storage tube whereby semiconductor devices may be further inhibited from sliding longitudinally between the tube ends by the insertion of additional pin type plugs therein, for example, where the tube is only partially filled with chips.

Such tubes may accommodate various types of integrated circuit chips having a variety of lead patterns and types. For example, thru-hole devices may be stored in such tubes, as well as surface mount type devices having various lead configurations (e.g., "j" type, "gull wing" type, and other type leads). In addition, the storage tubes may accommodate chips having leads on two opposite sides as well as those having leads on four sides. IC chips come in a variety of forms, such as microprocessors, dynamic random access memory (DRAM) chips, static random access memory (SRAM) chips, flash memory chips, gate arrays, etc, all of which may be stored in such semiconductor device storage tubes.

In the manufacture of semiconductor devices, the parts are typically tested prior to insertion into the storage tubes. Typically, the testing of the devices, as well as the insertion thereof into the storage tubes after testing, is done using automated test equipment or systems. Where one or more performance measures or characteristics of the tested devices is of concern (e.g., memory access time, processor or other logic device speed, A/D converter resolution), the test equipment may sort the tested devices according to such performance measure or measures. In other types of device testing, physical characteristics of the parts (e.g., coplanarity, lead spacing footprint, "tweeze" or outside lead dimensions, etc.) may be tested. For example, lead inspection stations provide for measurement of such dimensional attributes or characteristics associated with semiconductor chips. Tested semiconductor devices are sorted by the tester into groups of parts having similar tested performance and/or physical characteristics, and stored into storage tubes according to the sorting.

Semiconductor device testing is typically accomplished using automated testers having automatic device loading and unloading mechanisms located respectively at the input and output of the tester. Devices under test (DUTs) are loaded into the tester, and tested for one or more performance and/or physical characteristics. The tested devices are then sorted according to the test results and provided to an output stage of the tester or inspection station. The output stage may include one or more device output tracks in which the tested parts travel to storage tubes receiving the devices from the output track. Automatic tube replacement devices remove filled storage tubes and provide empty storage tubes to receive devices from the output tracks. In the past, the tube replacement devices were operated according to control signals from a programmable logic controller (PLC) or other type of controller, which actuated the replacement of filled tubes with empty tubes according to a sensor detecting whether the tubes were filled.

However, as the filled device storage tubes are removed, devices remaining in the output track may become jammed or otherwise be damaged. For example, a semiconductor device chip may be partially inserted in the entrance end of a storage tube or otherwise be near the tube when the tube replacement device removes the storage tube. Such devices in the output track may be jammed between the moving storage tube and adjacent components in the tester output stage, and device damage may result. In addition, devices partially inserted into the storage tube may become dislodged therefrom and fall during movement of the tube by the tube replacement device, in which case the device may also become damaged. Such damage to tested semiconductor devices at the output stage of a tester decreases the effective yield of the manufacturing process, and hence is costly. Thus, there is a need for methods and systems by which such device damage is reduced or eliminated.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter. The present invention provides systems and methods for testing semiconductor devices, using a tester providing tested semiconductor devices to a device output track, which feeds the semiconductor devices into a storage tube.

According to an aspect of the invention, the tester selectively removes the storage tube from the output track when the tube is filled and when no device is in the output track proximate the semiconductor storage tube. In addition, the tester refrains from removing the storage tube from the output track when a semiconductor device is in the device output track proximate the storage tube, so as to prevent or reduce damage to semiconductor devices during removal of the storage tube from the output track.

The test system may comprise a first sensor to detect whether the storage tube is filled with semiconductor devices and a second sensor to detect whether a semiconductor device is in the device output track proximate the semiconductor storage tube, wherein the second sensor may comprise a fiber optic sensor and an amplifier. In this case, the tester selectively removes the semiconductor storage tube from the output track when the first sensor indicates that the storage tube is filled and the second sensor indicates that no device is in the device output track proximate the storage tube, and refrains from removing the storage tube from the output track when the second signal indicates that a device is in the output track proximate the storage tube. The tester may also generate an alarm when the storage tube is filled with devices and when a semiconductor device is in the output track proximate the storage tube.

Another aspect of the invention provides a method of operating a semiconductor device tester, comprising providing semiconductor devices to a device output track associated with the tester and feeding semiconductor devices along the device output track into a semiconductor storage tube associated with the device output track. The method further comprises selectively removing the storage tube from the output track when the storage tube is filled and when no device is in the output track proximate the semiconductor storage tube, and refraining from removing the storage tube when a semiconductor device is in the output track proximate the tube, whereby damage to semiconductor devices during removal of the semiconductor storage tube from the device output track is reduced or prevented.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Referring now to the drawings, the various aspects of the invention are illustrated and described hereinafter with respect to several implementations and applications thereof, wherein like numbers are used to indicate like features wherever possible. The invention provides for prevention or a reduction in the likelihood of semiconductor device damage due to jamming and other occurrences when a storage tube is removed from a testing system device output track. The invention provides for removal of filled storage tubes from the output track when a tube is filled and when no other devices remain on or in the output track proximate the storage tube. When such a device is near the storage tube in the output track so as to make damage thereto likely or possible, the tube is not removed, and an alarm may be actuated to alert a user to clear such devices from potential harm in the output track, before resuming normal operation of the tester.

Figure 1A:
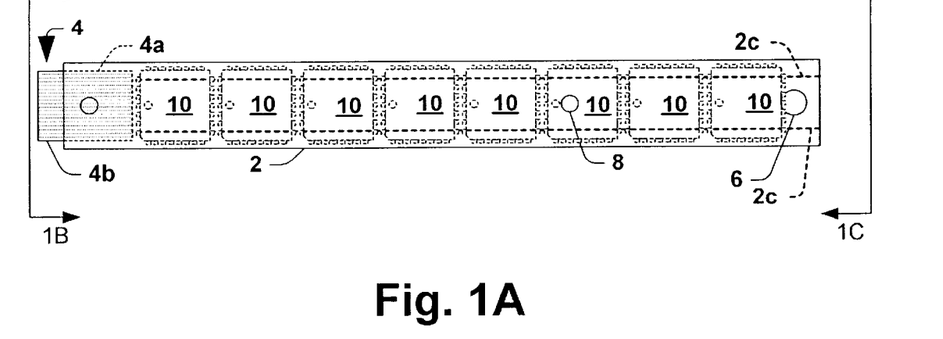
FIG. 1A is a top plan view illustrating an exemplary semiconductor device storage tube having semiconductor devices stored therein.
Figure 1B:
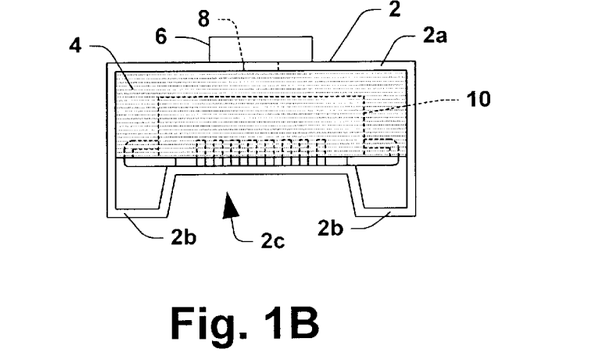
FIG. 1B is a side elevation view of the storage tube of FIG. 1A taken along line 1B—1B.
Figure 1C:
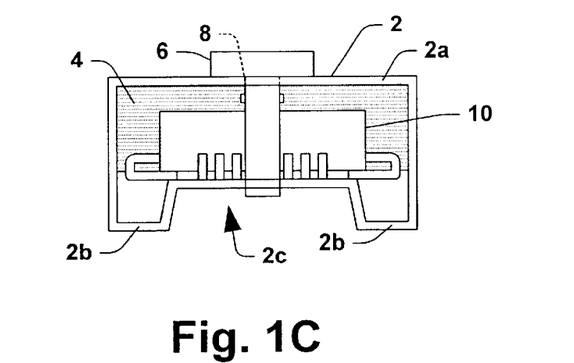
FIG. 1C is another side elevation view of the storage tube of FIG. 1A taken along line 1C—1C.

In order to provide context for the various aspects of the invention, FIGS. 1A through 1C illustrate an exemplary semiconductor device storage tube 2 filled with semiconductor devices or chips 10, and having a foam type plug 4 and a pin type plug 6 in opposite longitudinal ends thereof to prevent inadvertent removal of the chips 10 from the tube 2. The foam type plug 4 is inserted partially into the interior of the tube 2 whereby a first portion 4a extends into the tube 2 and a second portion 4b extends outwardly from the tube 4. The pin type plug 6 extends vertically through a hole 8 in a top wall 2a of the tube 2 at one end thereof. Other such vertically oriented holes 8 may be provided in the tube 2 for receiving pin type plugs 6 therein, which may be located at or between the ends of the tube 2. Corresponding holes (not shown) may also be provided in the bottom wall 2b or in an upwardly extending rib 2c of the tube 2, whereby pin type plugs 6 may be inserted vertically therethrough for preventing loss of the semiconductor devices 10 from the tube 2.

The plugs 4 and 6 may have a plug color and/or a plug shade which may be used to identify a performance measure or characteristic of the semiconductor devices 10 stored in the tube 2. Moreover, the tube 2 itself may be fashioned of colored or shaded material or otherwise be marked with a colored or shaded mark (not shown), whereby tubes 2 of different color or shade may be visually or otherwise differentiated. It will be appreciated that any combination of foam type plugs 4 and pin type plugs 6 may be employed in either longitudinal end of the tube 2, and that either type of plug 4 or 6, or colored or shaded markings on the tube 2, may be used to identify a particular performance characteristic associated with the devices 10 inside the tube, or to otherwise differentiate between multiple tubes 2.

Figure 2:
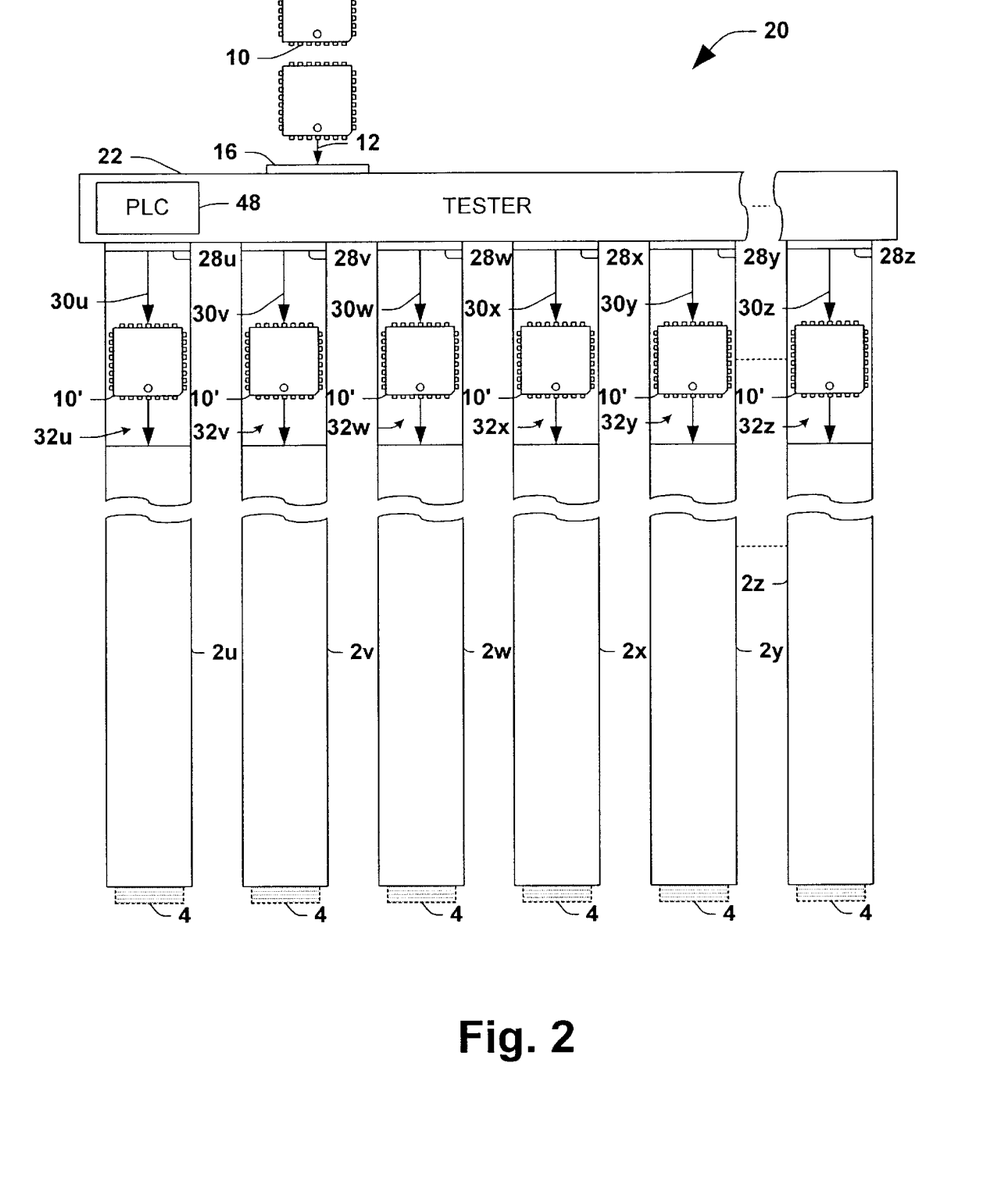
FIG. 2 is a schematic diagram illustrating a semiconductor device test system providing tested semiconductor devices to a plurality of storage tubes.

An exemplary test system 20 is illustrated in FIG. 2 having a semiconductor tester 22 adapted to test semiconductor devices 10 entering the tester 22 along an input path 12 via an input port 16. The semiconductor tester 22 is further adapted to selectively provide a tested semiconductor device 10' to one of a plurality of semiconductor storage tubes 2u, 2v, 2w, 2x, 2y, and 2z via a sorter mechanism (not shown) in the tester 22, according to a tested performance measure or measured physical characteristic (e.g., lead spacing, coplanarity, or the like) associated with the tested semiconductor devices 10'. The semiconductor device storage tubes 2u, 2v, 2w, 2x, 2y, and 2z, individually comprise foam type plugs 4u, 4v, 4w, 4x, 4y, and 4z, respectively, to prevent inadvertent loss of the semiconductor devices 10' from the tubes 2u, 2v, 2w, 2x, 2y, and 2z.

The tester 22 provides the tested devices 10' to the storage tubes 2u, 2v, 2w, 2x, 2y, and 2z via a plurality of output ports 28u, 28v, 28w, 28x, 28y, and 28z, along paths 30u, 30v, 30w, 30x, 30y, and 30z, respectively, and may comprise corresponding output device tracks 32u, 32v, 32w, 32x, 32y, and 32z in which the devices 10' travel from the output ports 28 to the entrance ends of the storage tubes 2. Although the exemplary tester 22 of FIG. 2 is illustrated as having 6 output ports 28, it will be recognized that the invention finds application in association with testers having any number of such ports 28. The tester 22 may thus test one or more performance measures or characteristics of the semiconductor devices 10 and selectively sort the tested devices 101 according to the test results. For example, the tester 22 may perform performance testing wherein the speed or other performance characteristic associated with the components 10. Alternatively or in combination, the tester 22 may measure one or more physical characteristics associated with the devices 10, such as lead spacing, coplanarity, and the like.

The sorted devices 10' are then provided to the appropriate output port 28 for insertion into the corresponding storage tubes 2, whereby the devices 10' in a given tube 2u, 2v, 2w, 2x, 2y, or 2z ill have the same or similar performance and/or physical capabilities or characteristics. In addition, it will be recognized that the plug color and/or plug shade associated with plugs 4u, 4v, 4w, 4x, 4y, and 4z in the respective tubes 2u, 2v, 2w, 2x, 2y, and 2z may be advantageously employed to indicate the characteristics of the devices in the storage tubes 2. As illustrated and described in greater detail hereinafter, the tester 22 in the test system 20 may comprise automated tube replacement apparatus (not shown) whereby the various storage tubes 2 are removed from the output tracks 32 as they become filled with tested components 10', and are replaced with empty tubes, whereby an essentially continuous automated testing operation may be performed in the system 20. The tester 22 further comprises a programmable logic controller 48 which may be programmed to perform one or more control functions associated with the operation of the system 20, including sorting, testing, and/or replacement of the filled storage tubes 2 with empty ones.

Figures 3A, 3B:
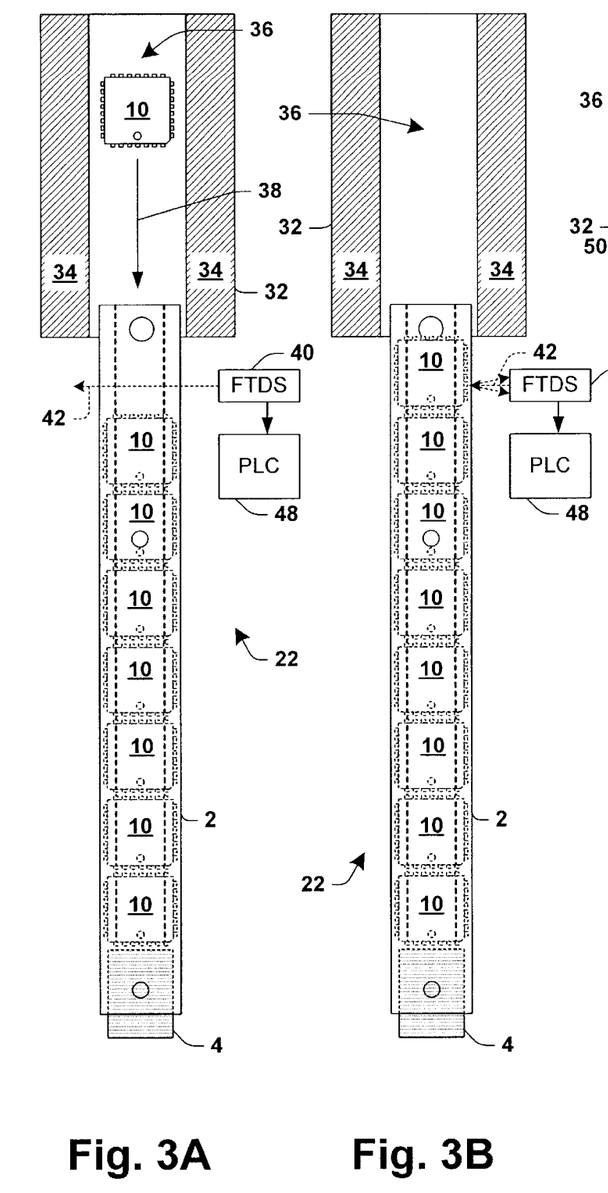
FIG. 3A is a top plan view of a portion of an exemplary semiconductor tester device output track providing tested semiconductor devices to storage tubes.
FIG. 3B is a top plan view of the tester device output track of FIG. 3A, wherein the storage tube is filled.
Figure 3C:
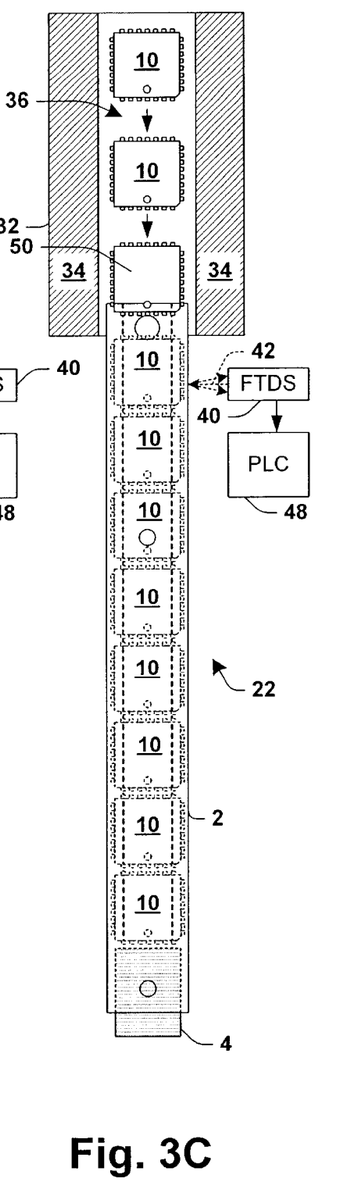
FIG. 3C is a top plan view of the tester device output track of FIGS. 3A and 3B, wherein semiconductor devices in the output track may become damaged upon removal of the filled storage tube.

Referring now to FIGS. 3A–3C, a portion of the tester 22 is illustrated for three different output operating conditions. As illustrated in FIG. 3A, the device output track 32 includes a pair of sidewalls 34 and a track 36 which may be recessed from the sidewalls 34, and along which the devices 10 travel from the tester output port (not shown) to the storage tube 2 associated with the output track 32 along the path indicated by the arrow 38. The tester 22 may further comprise a full tube detection sensor 40, such as an optical sensor, adapted to sense whether the tube 2 is filled with tested semiconductor devices 10 via a light ray 42, in order to provide a corresponding sensor signal to the PLC 48 associated with the tester 22. In this regard, the sensor 40 is located proximate an entrance end of the tube 2 whereat tested semiconductor devices 10 enter the tube 2 from the device output track 32. The PLC 48, in turn, may provide for automatic removal and replacement of filled storage tubes 2 with empty tubes according to the filled tube condition detected by the sensor 40, by actuation of a storage tube replacement device (not shown).

As shown in FIG. 3A, the light ray 42 from the filled tube detector sensor passes through the entrance end of the partially filled tube 2, whereby the sensor 40 indicates to the PLC 48 that the tube 2 is not yet filled with devices 10. The PLC 48 thus will not initiate replacement of the tube 2 at this point. Referring now to FIG. 3B, where the tube 2 becomes filled with semiconductor devices 10, the light ray 42 from the filled tube detection sensor 40 is reflected off a semiconductor device 10 at the entrance end of the tube 2, and back to the sensor 40, whereby the sensor 40 provides an appropriate signal indicating to the PLC 48 that the tube 2 is filled. The PLC, in turn, may initiate replacement of the filled tube 2 with an empty one using a tube replacement device (not shown) operatively connected with the PLC to receive a corresponding control signal therefrom.

As illustrated in FIG. 3C, however, the filled tube detection sensor 42 may indicate the filled status of the tube 2 to the PLC 48 where one or more semiconductor devices 10 remain on or in the output device track 32. For instance, a semiconductor device 50 may be in the output track 32 proximate the semiconductor storage tube 2 when the filled tube detector sensor 40 provides a filled tube sensor signal to the PLC 48. In this situation, automatic removal of the storage tube 2 in accordance with a control signal from the PLC 48 may cause the device 50 to become damaged due to jamming or through other mechanical perturbations caused by the movement of the tube 2 away from the output track 32. It will be further appreciated that such damage may also occur where the device 50 is proximate, but not partially inserted into the filled tube 2. As illustrated and described in greater detail hereinafter, the present invention prevents or minimizes the likelihood of such damage by advantageously refraining from removal of the tube under such conditions, for instance, where a semiconductor device is sufficiently near the storage tube that damage may result from movement of the storage tube.

Figure 4:
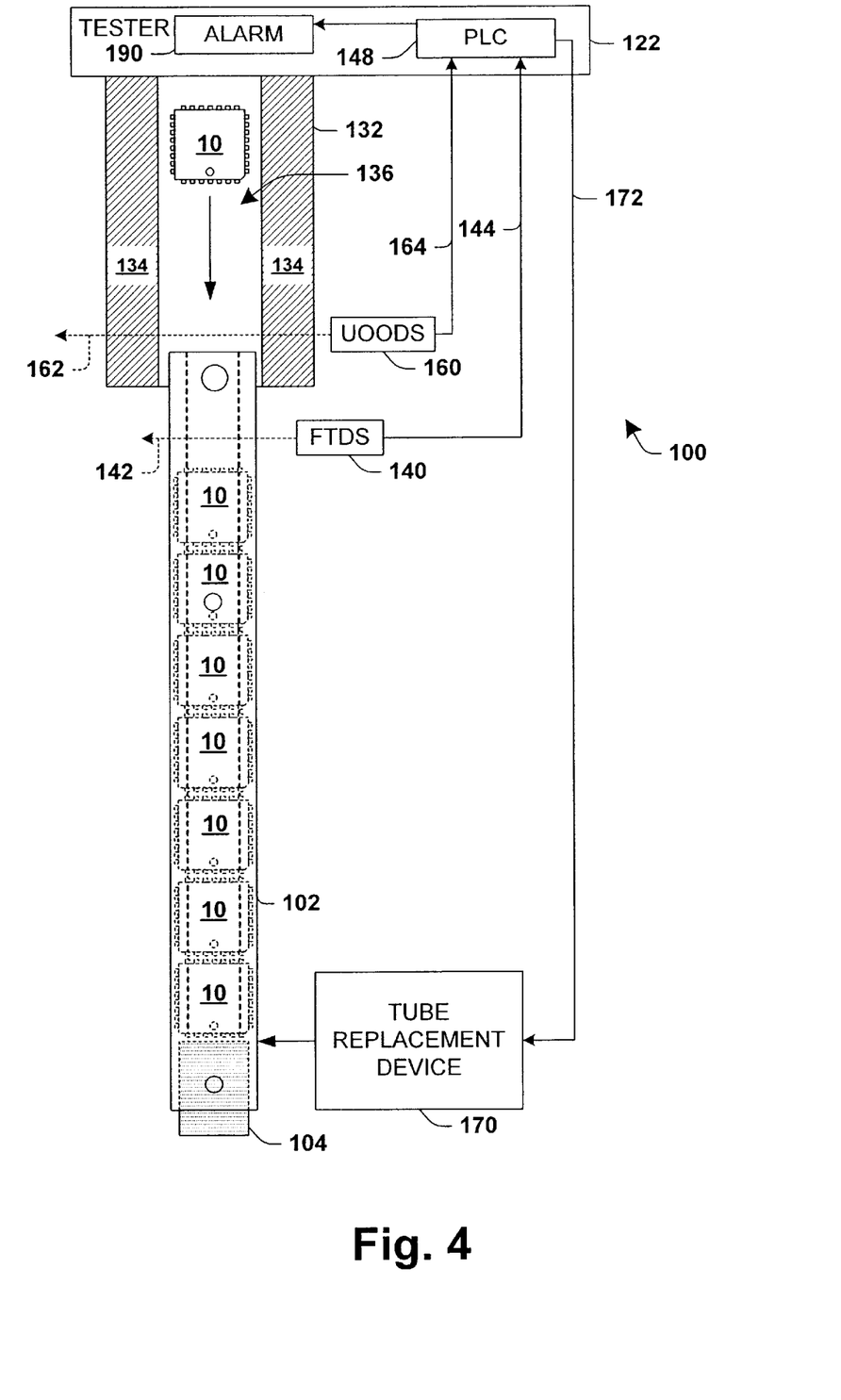
FIG. 4 is a top plan view of an exemplary test system adapted to prevent damage to tested semiconductor devices upon removal of storage tubes therefrom in accordance with an aspect of the present invention.
Figure 5:
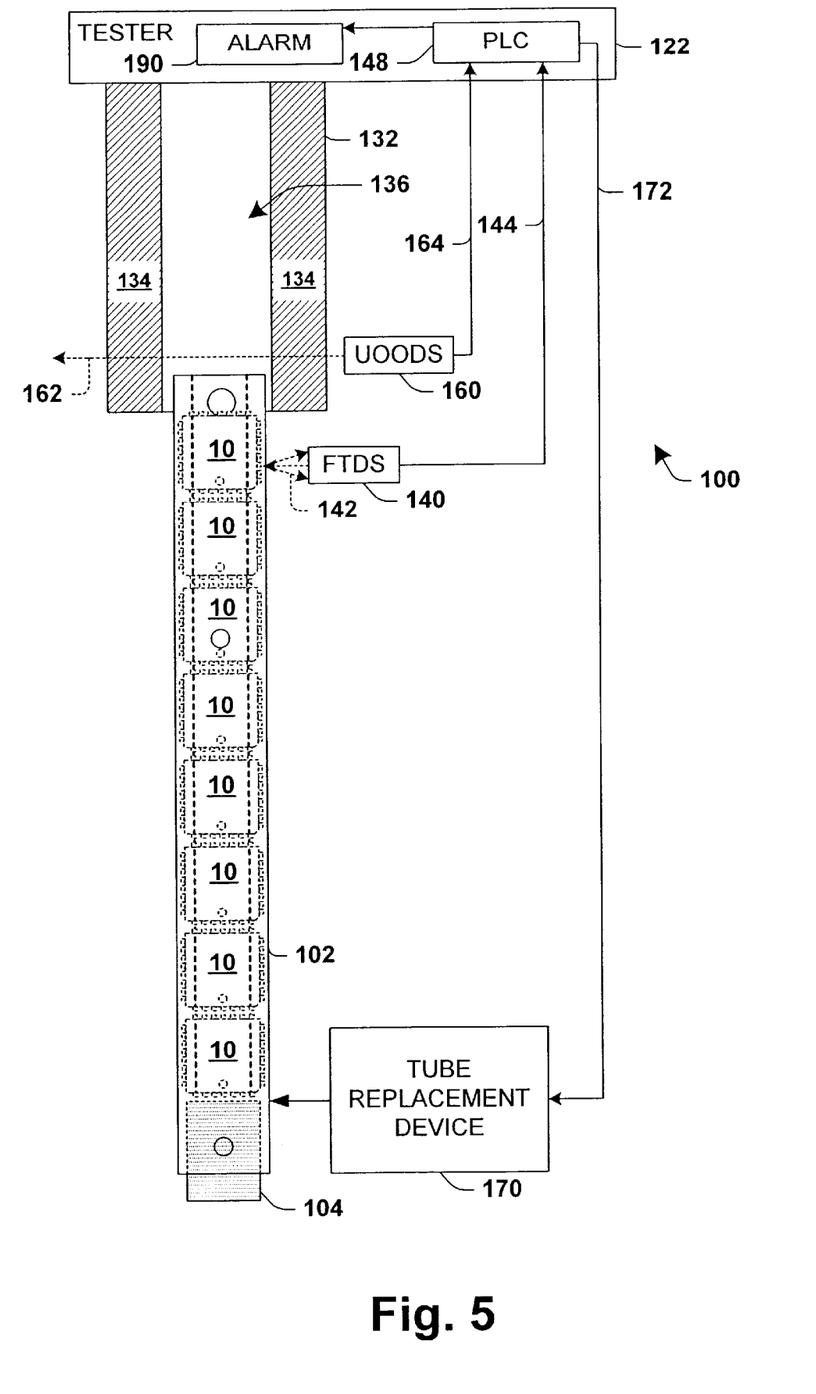
FIG. 5 is a top plan view of the exemplary test system of FIG. 4 in which a storage tube is filled.
Figure 6:
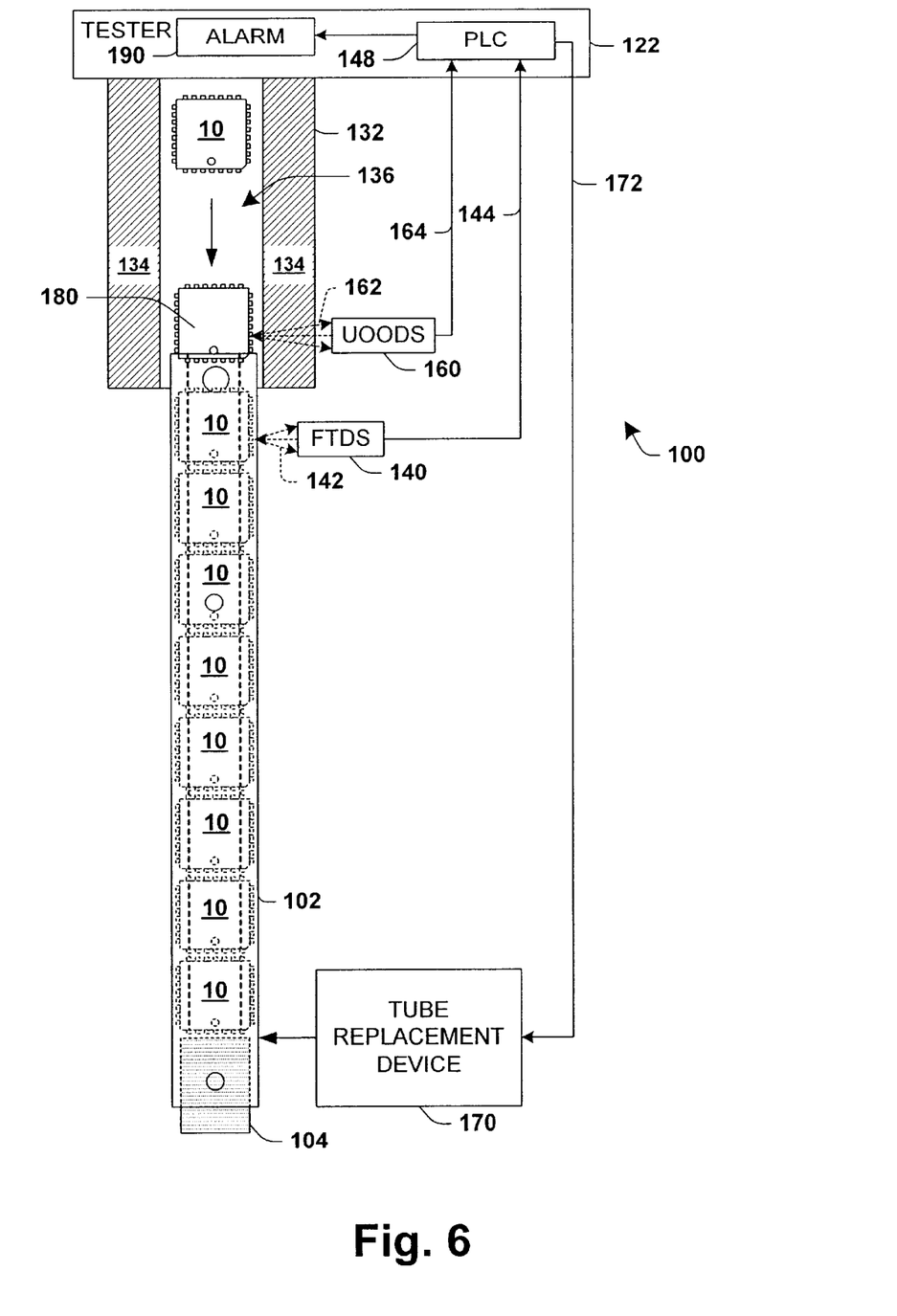
FIG. 6 is top plan view of the exemplary test system of FIGS. 4 and 5 in which the system refrains from removing the filled storage tube when a semiconductor device is in a device output track near the storage tube in accordance with the invention.

Referring now to FIG. 4, the invention advantageously provides for determining whether semiconductor devices are in the device output track proximate the storage tube prior to initiating removal and/or replacement of a filled storage tube. An exemplary semiconductor testing system 100 is illustrated having a semiconductor tester 122 adapted to test semiconductor devices 10 and to provide semiconductor devices 10 to a device output track 132. Although FIGS. 4–6 illustrate the operation of certain aspects of the invention in association with semiconductor devices 10 having PLCC package types with "j" type leads on four sides thereof, it will be appreciated that the invention finds application in association with any type of semiconductor device package type, including but not limited to thru-hole devices, devices with leads on two sides, "gull wing" leaded devices, and the like. The track 132 may include sidewalls 134 laterally on either side of a recessed track 136, wherein the device output track 132 feeds the semiconductor devices 10 into a semiconductor storage tube 102 associated with the device output track 132.

The tester 122 is adapted to selectively remove the semiconductor storage tube 102 from the device output track 132 when the storage tube 102 is filled with semiconductor devices 10 and when no semiconductor device 10 is in the device output track 132 proximate the semiconductor storage tube 102 in accordance with the invention. The tester 122 is further adapted to refrain from removing the semiconductor storage tube 102 when a semiconductor device 10 is in the device output track 132 proximate the semiconductor storage tube 102, whereby damage to semiconductor devices 10 during removal of the storage tube 102 from the device output track 132 is reduced or eliminated, in accordance with the invention. For instance, the tester 122 of the system 100 may comprise a first sensor 140 operative to detect whether the storage tube 102 is filled with semiconductor devices 10 and to provide a first sensor signal 144 to a PLC 148 in the tester 122 indicating that the storage tube 102 is filled with semiconductor devices 10. For instance, the sensor 140 may generate a light ray 142 directed toward the entrance end of the storage tube 102 and may sense whether the light ray 142 is reflected back to the sensor 140.

The tester 122 further comprises a second sensor 160 operative to detect whether a semiconductor device 10 is in the device output track 132 proximate the semiconductor storage tube 102, such as via a light ray 162 directed across the track 136 of the output track 136 near the entrance end of the tube 102. This unit on output detection sensor (UOODS) 160 provides a second sensor signal 164 to the tester 122 when a semiconductor device 10 is in the device output track proximate the semiconductor storage tube 102. The tester 122 is adapted to selectively remove the semiconductor storage tube 102 from the device output track 132 when the first sensor signal 144 indicates to the PLC 148 that the storage tube 102 is filled and when the second sensor signal 164 indicates that no semiconductor device 10 is in the device output track 132 proximate the semiconductor storage tube 102. In addition, the tester 122 refrains from removing the storage tube 102 from the output track 132 when the second sensor signal 164 indicates that a device 10 is in the device output track 132 proximate the semiconductor storage tube 102.

The exemplary tester 122 further comprises a tube replacement device 170 operatively connected with the tester 122 and adapted to remove the semiconductor storage tube 102 from the device output track 132 according to a control signal 172 from the PLC 148 of the tester 122, wherein the PLC 148 selectively provides the control signal 172 to the tube replacement device 170 for removal of the semiconductor storage tube 102 from the device output track 132 when the first sensor signal 144 indicates that the storage tube 102 is filled and when the second sensor signal 164 indicates that no semiconductor device 10 is in the device output track 132 proximate the tube 102.

In addition, the PLC 148 is programmed to refrain from providing the control signal 172 to the tube replacement device 170 when the second sensor signal 164 indicates that a semiconductor device (not shown) is in the device output track 132 proximate the semiconductor storage tube 102, as illustrated further in FIG. 6. Moreover, where such a condition exists, the PLC 148 may provide an alarm signal to actuate an alarm 190, such as a light, audible annunciator, or the like. This may indicate to an operator, that the device or devices 10 should be removed or cleared away from the filled tube 102, after which the system 100 may be reset for continuation of automated testing operation. The tube replacement device 170 may be further adapted to replace the filled semiconductor storage tube 102 with an empty semiconductor storage tube (not shown) after removal of the filled semiconductor storage tube 102 from the device output track 132, upon receipt of the control signal 172 from the PLC 148.

The UOODS sensor 164 may comprise a fiber optic sensor 160 mounted on the tester 122 proximate the device output track 132 so as to detect the presence of semiconductor devices 10 in the device output track 132 proximate the semiconductor storage tube 102, and an amplifier (not shown) receiving a signal from the sensor 160 indicative of the presence of a semiconductor device 10 in the device output track 132 proximate the semiconductor storage tube 132, and providing the second sensor signal 164 to the tester. Alternatively, the sensor 160 and amplifier may be integrated into a single unit 160 as illustrated in FIGS. 4, 5, and 6.

As illustrated in FIG. 4, the semiconductor storage tube 102 is not filled, and accordingly, the filled tube detection sensor 140 provides no filled signal 144 to the PLC 148. Referring now to FIG. 5, where the tube 102 is filled with devices 10, the filled tube detection sensor 140 provides a filled tube signal 144 to the PLC 148. As no other devices 10 are in the output track 132 near the tube 102, the UOODS sensor 160 provides no signal to the PLC 148, whereby the PLC 148 may provide the control signal 172 to the tube replacement device 170 in order for the device 170 to remove the filled tube 102 and replace it with an empty tube (not shown).

In FIG. 6, another situation is illustrated in which the storage tube 102 is filled with semiconductor devices 10, and where an additional semiconductor device 180 is located in the device output track 132 proximate the entrance end of the tube 102. In this situation, the exemplary tester 122 is adapted to refrain from removing the filled tube 102 in order to prevent or minimize damage to the device 180 (e.g., and/or to other devices 10 in the track 132 or in the tube 102). For instance, in this situation, the filled tube detection sensor 140 provides a signal 144 to the PLC 148 of the tester 122 indicating that the storage tube 102 is filled. In addition, however, the unit on output detection sensor 160 receives reflected light rays 162 from the semiconductor device 180 in the output track 132, and accordingly provides a second sensor signal 164 to the PLC 148 indicating the presence of the device 180 in the track 132 proximate the storage tube 102.

The PLC 148 of the tester 122 accordingly refrains from removing the tube 102 (e.g., by not providing the control signal 172 to the tube replacement device 170), and may also actuate the alarm 190 to alert an operator to clear the potentially damaging situation. Alternatively or in combination, the PLC 148 may actuate automated mechanisms (e.g., such as vacuum pick and place apparatus or other device handling components, not shown) in order to automatically clear the potentially damaging situation, such as by removing the device 180 from the output track 132. One the device 180 has been removed from the track 132 or otherwise been moved sufficiently far away from the entrance end of the filled tube 102, the PLC may then proceed to actuate the tube replacement device 170 via the control signal 172, whereafter normal automated testing operation may resume.

Another aspect of the invention provides a methodology for operating a semiconductor tester by which damage to tested semiconductor devices may be prevented or reduced. The methodology comprises providing semiconductor devices to a device output track associated with the tester, feeding semiconductor devices along the device output track into a semiconductor storage tube associated with the device output track, selectively removing the semiconductor storage tube from the device output track when the storage tube is filled with semiconductor devices and when no semiconductor device is in the device output track proximate the semiconductor storage tube, and refraining from removing the semiconductor storage tube from the device output track when a semiconductor device is in the device output track proximate the semiconductor storage tube, whereby damage to semiconductor devices during removal of the semiconductor storage tube from the device output track is reduced.

Figure 7:
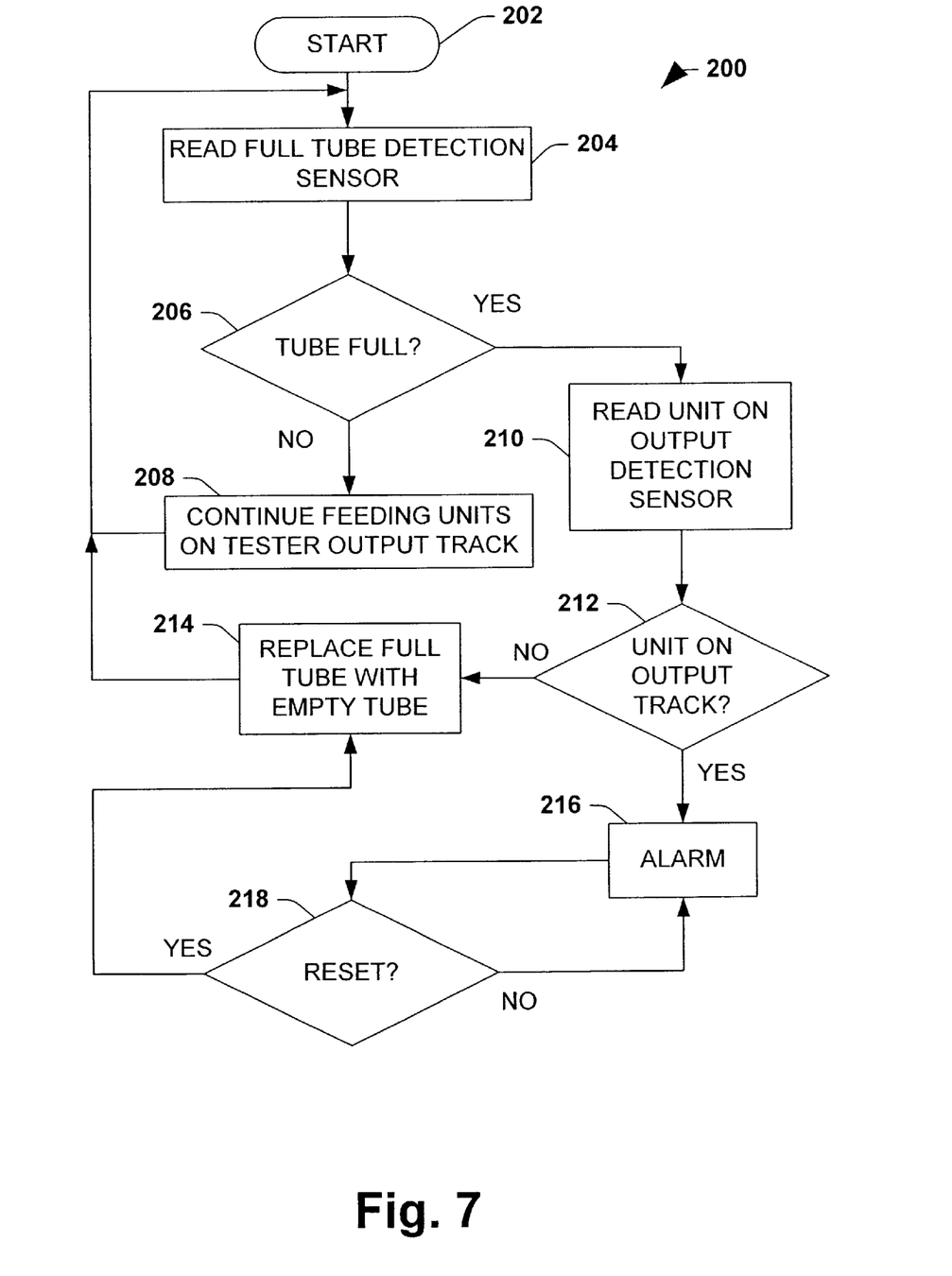
FIG. 7 is a flow diagram illustrating an exemplary method of operating a semiconductor device tester in accordance with another aspect of the invention.

An exemplary method 200 is illustrated in FIG. 7 for operating a semiconductor device tester in accordance with the present invention. It will be appreciated that although the exemplary method 200 is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated and described herein, in accordance with the invention. Moreover, not all illustrated blocks, events, or acts, may be required to implement a methodology in accordance with the present invention. In addition, it will be appreciated that the exemplary method 200, as well as other methods according to the invention, may be implemented in association with the testing systems illustrated and described herein, as well as in association with other testing systems and apparatus not illustrated or described.

Beginning at 202, the exemplary method 200 comprises reading a fall tube detection sensor at 204 and determining therefrom whether the tube is filled at 206. If not, the method 200 proceeds to 208, where the feeding of tested semiconductor devices or units is continued along the tester output track. This continues via 204 and 206 until the tube is determined to be filled at 206, whereafter a unit on output detection sensor (e.g., sensor 160 of FIGS. 4–6) is read at 210. A determination is then made at 212 as to whether any devices or units are on the output track. If not, the filled tube is replaced at 214 and the method 200 returns to 204 as described above.

However, if there is a unit on the output track at 212, an alarm is actuated at 216, which may indicate to an operator that a potential damage situation exists in the tester. The operator may then rectify the situation and reset the system in response to the alarm at 216. At 218, a determination is made as to whether the tester has been reset. If not, the alarm condition is continued at 216. Once a reset has occurred at 218, the method 200 proceeds to 214, where the filled tube is replaced with an empty one. Thereafter, the method 200 returns to 204 as described above, whereby filling of the replacement tube is accomplished. The method 200 thus selectively replaces the filled tube unless the unit on output track sensor indicates that a device may be in danger of damage caused by movement of the filled tube away from the device output track. Thus, the exemplary methodology 200 reduces or prevents component damage in an automated semiconductor testing system in accordance with the present invention.

Although the invention has been shown and described with respect to certain implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary applications and implementations of the invention.

In addition, while a particular feature of the invention may have been disclosed with respect to only one of several aspects or implementations of the invention, such a feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising" and its variants.

What is claimed is:

1. A test system for testing semiconductor devices, comprising:

a semiconductor tester adapted to test semiconductor devices and to provide semiconductor devices to a device output track, wherein the device output track feeds the semiconductor devices into a semiconductor storage tube associated with the device output track;

wherein the tester is adapted to selectively remove the semiconductor storage tube from the device output track when the storage tube is filled with semiconductor devices and when no semiconductor device is in the device output track proximate the semiconductor storage tube, and to refrain from removing the semiconductor storage tube from the device output track when a semiconductor device is in the device output track proximate the semiconductor storage tube, whereby damage to semiconductor devices during removal of the semiconductor storage tube from the device output track is reduced.

2. The system of claim 1, further comprising:

a first sensor operative to detect whether the storage tube is filled with semiconductor devices and to provide a first sensor signal to the tester indicating that the storage tube is filled with semiconductor devices; and a second sensor operative to detect whether a semiconductor device is in the device output track proximate the semiconductor storage tube and to provide a second sensor signal to the tester when a semiconductor device is in the device output track proximate the semiconductor storage tube;

wherein the tester is adapted to selectively remove the semiconductor storage tube from the device output track when the first sensor signal indicates that the storage tube is filled with semiconductor devices and when the second sensor signal indicates that no semiconductor device is in the device output track proximate the semiconductor storage tube, and to refrain from removing the semiconductor storage tube from the device output track when the second sensor signal indicates that a semiconductor device is in the device output track proximate the semiconductor storage tube.

3. The system of claim 2, wherein the tester comprises a tube replacement device operatively connected with the tester and adapted to remove the semiconductor storage tube from the device output track according to a control signal from the tester, and wherein the tester is adapted to selectively provide the control signal to the tube replacement device for removal of the semiconductor storage tube from the device output track when the first sensor signal indicates that the storage tube is filled with semiconductor devices and when the second sensor signal indicates that no semiconductor device is in the device output track proximate the semiconductor storage tube, and to refrain from providing the control signal to the tube replacement device when the second sensor signal indicates that a semiconductor device is in the device output track proximate the semiconductor storage tube.

4. The system of claim 3, wherein the tester comprises a controller adapted to receive the first and second sensor signals from the first and second sensors, respectively, and to selectively provide the control signal to the tube replacement device for removal of the semiconductor storage tube from the device output track when the first sensor signal indicates that the storage tube is filled with semiconductor devices and when the second sensor signal indicates that no semiconductor device is in the device output track proximate the semiconductor storage tube and to refrain from providing the control signal to the tube replacement device when the second sensor signal indicates that a semiconductor device is in the device output track proximate the semiconductor storage tube.

5. The system of claim 4, wherein the tube replacement device is adapted to replace the filled semiconductor storage tube with an empty semiconductor storage tube after removal of the filled semiconductor storage tube from the device output track.

6. The system of claim 5, wherein the second sensor comprises a fiber optic sensor mounted on the tester proximate the device output track so as to detect the presence of semiconductor devices in the device output track proximate the semiconductor storage tube, and an amplifier receiving a signal from the second sensor indicative of the presence of a semiconductor device in the device output track proximate the semiconductor storage tube, and providing the second sensor signal to the tester.

7. The system of claim 5, wherein the tester is adapted to generate an alarm when the storage tube is filled with semiconductor devices and when a semiconductor device is in the device output track proximate the semiconductor storage tube.

8. The system of claim 3, wherein the tube replacement device is adapted to replace the filled semiconductor storage tube with an empty semiconductor storage tube after removal of the filled semiconductor storage tube from the device output track.

9. The system of claim 2, wherein the second sensor comprises a fiber optic sensor mounted on the tester proximate the device output track so as to detect the presence of semiconductor devices in the device output track proximate the semiconductor storage tube, and an amplifier receiving a signal from the second sensor indicative of the presence of a semiconductor device in the device output track proximate the semiconductor storage tube, and providing the second sensor signal to the tester.

10. A method of operating a semiconductor device tester, comprising:

providing semiconductor devices to a device output track associated with the tester;

feeding semiconductor devices along the device output track into a semiconductor storage tube associated with the device output track;

selectively removing the semiconductor storage tube from the device output track when the storage tube is filled with semiconductor devices and when no semiconductor device is in the device output track proximate the semiconductor storage tube; and refraining from removing the semiconductor storage tube from the device output track when a semiconductor device is in the device output track proximate the semiconductor storage tube, whereby damage to semiconductor devices during removal of the semiconductor storage tube from the device output track is reduced.

11. The method of claim 10, further comprising:

sensing whether the storage tube is filled with semiconductor devices using a first sensor;

sensing whether a semiconductor device is in the device output track proximate the semiconductor storage tube using a second sensor.

12. The method of claim 11, further comprising:

providing a tube replacement device operatively connected with the tester to remove the semiconductor storage tube from the device output track according to a control signal from the tester;

selectively providing the control signal to the tube replacement device for removal of the semiconductor storage tube from the device output track when the storage tube is filled with semiconductor devices and when no semiconductor device is in the device output track proximate the semiconductor storage tube; and refraining from providing the control signal to the tube replacement device when a semiconductor device is in the device output track proximate the semiconductor storage tube.

13. The method of claim 12, wherein sensing whether the storage tube is filled with semiconductor devices comprises providing a first sensor signal from the first sensor to the tester when the storage tube is filled with semiconductor devices, and wherein sensing whether a semiconductor device is in the device output track proximate the semiconductor storage tube comprises providing a second sensor signal from the second sensor to the tester when a semiconductor device is in the device output track proximate the semiconductor storage tube.

14. The method of claim 13, wherein the tester comprises a controller adapted to receive the first and second sensor signals from the first and second sensors, respectively, and wherein selectively providing the control signal to the tube replacement device comprises providing the control signal when the first sensor signal indicates that the storage tube is filled with semiconductor devices and when the second sensor signal indicates that no semiconductor device is in the device output track proximate the semiconductor storage tube.

15. The method of claim 14, wherein refraining from providing the control signal to the tube replacement device comprises refraining from providing the control signal when the second sensor signal indicates that a semiconductor device is in the device output track proximate the semiconductor storage tube.

16. The method of claim 15, further comprising generating an alarm when the storage tube is filled with semiconductor devices and when the second sensor signal indicates that a semiconductor device is in the device output track proximate the semiconductor storage tube.

17. The method of claim 16, further comprising replacing the filled semiconductor storage tube with an empty semiconductor storage tube after removal of the filled semiconductor storage tube from the device output track.

18. The method of claim 10, further comprising generating an alarm when the storage tube is filled with semiconductor devices and when a semiconductor device is in the device output track proximate the semiconductor storage tube.

19. A system for testing semiconductor devices, comprising:

a semiconductor tester adapted to test semiconductor devices and to provide semiconductor devices to a device output track, wherein the device output track feeds the semiconductor devices into a semiconductor storage tube associated with the device output track; and     means for removing the semiconductor storage tube from the device output track when the storage tube is filled with semiconductor devices and when no semiconductor device is in the device output track proximate the semiconductor storage tube; and     means for refraining from removing the semiconductor storage tube from the device output track when a semiconductor device is in the device output track proximate the semiconductor storage tube, whereby damage to semiconductor devices during removal of the semiconductor storage tube from the device output track is reduced.

20. The system of claim 19, wherein the means for removing the semiconductor storage tube comprises:

means for sensing whether the storage tube is filled with semiconductor devices; and     means for sensing whether a semiconductor device is in the device output track proximate the semiconductor storage tube.

21. The system of claim 20, wherein the means for sensing whether a semiconductor device is in the device output track proximate the semiconductor storage tube comprises:

a fiber optic sensor mounted on the tester proximate the device output track so as to detect the presence of semiconductor devices in the device output track proximate the semiconductor storage tube device; and     an amplifier, receiving a signal from the second sensor indicative of the presence of a semiconductor device in the device output track proximate the semiconductor storage tube, and providing a sensor signal to the tester.

\* \* \* \* \*